United States Patent
Li et al.

(10) Patent No.: US 9,520,355 B2
(45) Date of Patent: Dec. 13, 2016

(54) VOLTAGE AND TEMPERATURE INDEPENDENT MIM CAPACITORS

(71) Applicant: WaferTech, LLC, Camas, WA (US)

(72) Inventors: Hsin-I Li, Camas, WA (US); Wen-Bin Tsai, Camas, WA (US); Kin Fung Lam, Vancouver, WA (US)

(73) Assignee: WAFERTECH. LLC, Camas, WA (US)

( * ) Notice: Subject to any disclaimer, the term of this patent is extended or adjusted under 35 U.S.C. 154(b) by 44 days.

(21) Appl. No.: 14/170,151

(22) Filed: Jan. 31, 2014

(65) Prior Publication Data

US 2015/0221713 A1    Aug. 6, 2015

(51) Int. Cl.
*H01L 21/02* (2006.01)
*H01L 23/522* (2006.01)
*H01L 27/08* (2006.01)
*H01L 49/02* (2006.01)

(52) U.S. Cl.
CPC ....... *H01L 23/5223* (2013.01); *H01L 27/0805* (2013.01); *H01L 28/40* (2013.01); *H01L 2924/0002* (2013.01)

(58) Field of Classification Search
CPC ....... H01L 23/34; H01L 23/5223; H01L 28/60

USPC .......................................... 257/532; 438/396
See application file for complete search history.

(56) References Cited

U.S. PATENT DOCUMENTS

| 8,314,452 B2 | 11/2012 | Riess et al. |
| 2007/0052107 A1* | 3/2007 | Weng et al. ................ 257/774 |
| 2014/0187018 A1* | 7/2014 | Malhotra et al. ........... 438/396 |

* cited by examiner

*Primary Examiner* — Trung Q Dang
(74) *Attorney, Agent, or Firm* — Duane Morris LLP

(57) ABSTRACT

MIM capacitors that are temperature and/or voltage independent, and a methodology for formulating the MIM capacitors for use in semiconductor integrated circuits, is provided. Vertical MIM capacitive structures include at least two vertically separated electrodes and a capacitor dielectric that includes portions of different dielectric materials provided in a desired area ratio. The disclosure provided for selecting dielectrics and dielectric thicknesses, determining an area ratio that produces temperature and/or voltage independent MIM capacitors, and forming capacitive devices with the desired area ratio. In one embodiment, the capacitor dielectric includes at least one SiO dielectric portion and at least one SiN dielectric portion and a total capacitive area includes the SiN and SiO dielectric portions arranged such that the ratio of the area of the SiO portions to the area of the SiN portions is about 1.15:1.

20 Claims, 5 Drawing Sheets

VOLTAGE AND TEMPERATURE INDEPENDENT MIM CAPACITORS

TECHNICAL FIELD

The disclosure relates most generally to semiconductor devices, and more particularly, to temperature and voltage independent MIM (metal insulator metal) capacitive devices.

BACKGROUND

Semiconductor devices are used in many electronic and other applications. Semiconductor devices are integrated circuits that are formed on semiconductor or other substrates by depositing many levels and types of thin films over the substrate and patterning to form individual components that form the integrated circuit. Various different types of integrated circuits and other semiconductor devices are fabricated using various technologies.

There is a demand in semiconductor device technology to integrate many different functions on a single chip, i.e. in a single integrated circuit. For example, it is desirable to manufacture both analog and digital circuitry in the same integrated circuit. In such applications, capacitors are extensively used for storing electric charge. One favored type of capacitor is an MIM (metal insulator metal) capacitor. MIM capacitors are built at the back end of the semiconductor device fabrication process. MIM capacitors store charge and are useful in many purposes, including minimizing parasitic capacitance between interconnect features. It is known, however, that MIM capacitors tend to have a capacitance that drifts either with temperature or applied stress, i.e. voltage. Semiconductor devices require precision MIM capacitors immune from such operating variabilities.

It would therefore be desirable to provide temperature and voltage independent capacitors.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

Figure 1:
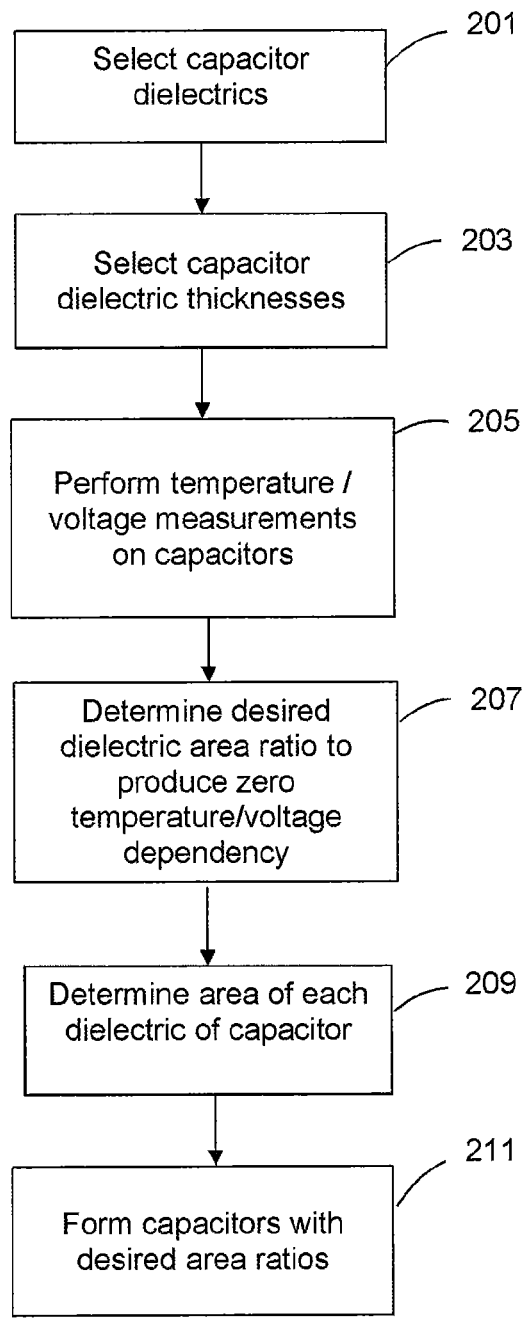
FIG. 1 is a flow chart of a method for designing and forming temperature and voltage independent MIM capacitors according to various embodiments of the disclosure.

The present disclosure provides capacitive devices with low voltage coefficients and low temperature coefficients and methods for designing, formulating and forming the same.

Capacitors with ideal coefficients of capacitance are needed, wherein the coefficient of capacitance is defined as the variation in capacitance of the capacitor with a corresponding variation in an operating parameter. For example, the variation in capacitance of a capacitor with a change in temperature is defined as the temperature coefficient of dielectric constant of capacitance (or, simply, the temperature coefficient of capacitance, TCC), and the variation in capacitance of a capacitor with a change in voltage is defined as a voltage coefficient of dielectric constant of capacitance (or, simply, the voltage coefficient of capacitance, VCC). Dielectric films commonly used in semiconductor industry, however, introduce significant voltage and temperature coefficients as described below. Some capacitor dielectrics have a capacitance that increases with temperature (a positive temperature dependency) and other capacitors have a capacitance that decreases with temperature (a negative temperature dependency). The same is true for voltage. Some capacitor dielectrics have a capacitance that increases with voltage (a positive voltage dependency) and other capacitors have a capacitance that decreases with voltage (a negative voltage dependency).

MIM and other capacitive devices fabricated with low voltage coefficients, i.e. those exhibiting a high linearity over a broad voltage range, are needed and are provided in the present disclosure. Similarly, MIM capacitive devices with a low temperature coefficient or a small temperature dependence i.e. exhibiting a high linearity over a broad temperature range, are needed and are provided in the present disclosure.

In various embodiments, the present disclosure provides for combining dielectric materials to form an MIM capacitor or capacitive device with a capacitor dielectric formed of portions of multiple dielectrics arranged and present in a particular ratio. The MIM capacitors exhibit an overall dielectric constant produced by combination of the dielectric constants of the two dielectric materials. In some embodiments, a zero temperature coefficient capacitor, i.e. a capacitor with high linearity over a broad temperature range, is produced. In some embodiments, a capacitor with a zero voltage coefficient is produced, i.e. a capacitor with a high linearity over a broad voltage range. In some embodiments, a capacitor with both a zero voltage coefficient and a zero temperature coefficient is produced.

The disclosure provides a methodology for formulating temperature and voltage independent MIM capacitive devices that include one or more vertical capacitors. Various combinations of dielectric materials are combined to form the capacitor dielectric of a capacitor, in various embodiments. In one embodiment, two dielectric materials with different dielectric coefficients of temperature and/or voltage are chosen and are used to form various capacitor devices with a capacitor dielectric, i.e. the dielectric area between the electrodes, that includes portions of each of the different dielectric materials. In some embodiments, the dielectrics are arranged lateral to one another at one device level and the electrodes are vertically separated and electrically isolated by the dielectrics. An area ratio of the dielectric materials that produced a capacitor with a capacitance that is independent of temperature, is identified. The respective areas of the two dielectric materials are present in various ratios in the capacitors which are produced to be temperature independent, voltage independent, or both.

In some embodiments, two dielectric materials are chosen. Dielectric thicknesses are then chosen for each of the capacitor dielectrics. The voltage and/or temperature dependencies of both dielectrics are then determined. In some embodiments, temperature is used. If the dielectrics have opposite (one negative, the other positive) temperature dependencies, calculations are performed to identify a correct area ratio of the two dielectrics to form a temperature independent capacitor. Total areas of each dielectric are the determined and the capacitor is fabricated. In other embodiments, voltage is used instead of temperature and the above procedure is followed. In various embodiments of the disclosure, the capacitive device is formed over a substrate and includes one or more vertical capacitors, each with vertically separated and electrically isolated capacitor plates with the two dielectrics arranged laterally and at the same device level such that the dielectric areas are the surface areas of the dielectric film formed over the substrate.

The disclosure also provides MIM capacitive devices for use in semiconductor integrated circuits or other semiconductor or other devices. The MIM capacitive structures include at least two electrodes and a capacitor dielectric that includes portions of different dielectric materials provided in a desired area ratio. In one embodiment, the capacitor dielectric includes at least an SiO dielectric portion and a SiN dielectric portion between the electrodes. In some embodiments, the SiN is stoichiometric silicon nitride, $Si_3N_4$, and in some embodiments the SiO is stoichiometric silicon dioxide, $SiO_2$. Other forms of SiN and other forms of SiO are used in other embodiments. The MIM capacitor is formed to be temperature and voltage independent by forming the capacitor dielectric such that the capacitor dielectric includes a combination of portions of SiN and portions of SiO such that the ratios of their areas is a desired ratio that produces a temperature and voltage independent capacitor. In one advantageous embodiment, the total capacitive area includes SiN dielectric portions and SiO dielectric portions arranged such that the ratio of the area of the SiO portions to the area of the SiN portions is about 3:2.6 or about 1.15:1. In one embodiment, the ratio of the area of the SiO portions to the area of the SiN portions is at least about 1.15:1. In other embodiments, the ratio of the area of the SiO portions to the area of the SiN portions differs.

In other embodiments, other dielectrics combined in various ratios are used.

In various embodiments of the disclosure, two dielectric materials are chosen. This is done at step 101 "select capacitor dielectrics" of FIG. 1. Various high-k dielectrics, low-k dielectrics, oxides, nitrides, carbides, oxynitrides, and other dielectric materials are used in various embodiments. Any of various factors such as manufacturability or other device considerations are used in determining the dielectrics. At step 103, the thicknesses of each of the dielectrics are also chosen. In some embodiments, the thicknesses are the same, and in other embodiments, the thicknesses differ. Dielectric type and thickness may be dictated by manufacturability or other factors in various embodiments. At step 105, capacitors are fabricated using each of the chosen dielectric materials. Temperature or voltage measurements are performed on the capacitors to determine the temperature or voltage dependencies, e. g. the temperature or voltage coefficients of capacitance. In the present description, temperature will be measured and used as the factor i.e. the temperature coefficients of dielectric constant of capacitance $S_1$ and $S_2$ used to form capacitors that are temperature independent. In other embodiments, voltage is used and voltage can replace temperature in the following description.

Capacitors are formed of each of the dielectric materials and the temperature dependency of the dielectric material is tested. The formed capacitors may be test capacitors and each include only one of the selected capacitor dielectrics. In some embodiments, the dielectric has a positive temperature dependency whereby the capacitance increases with temperature and the temperature coefficient of dielectric constant of capacitance $S_x$, is a positive number. In other embodiments, the dielectric has a negative temperature dependency in which the capacitance decreases with increased temperature and the temperature coefficient of dielectric constant of capacitance $S_x$, is a negative number. This is done for each of the dielectric materials at step 105. The disclosure provides for determining that the two dielectrics to be used have opposite temperature coefficients, i.e. opposite mathematical signs such that one is positive and one is negative.

At step 107, the desired dielectric area ratio to produce a zero temperature dependent capacitor is determined. In some embodiments, the relative areas is determined using the following equations.

$$\frac{\epsilon_1(T_o)A_1}{d_1}S_1 = \frac{\epsilon_2(T_o)A_2}{d_2}S_2$$

or, $$c_1(T_o)A_1S_1 = c_2(T_o)A_2S_2$$

In the preceding equations, $c_1$ and $c_2$ represent capacitance density per unit area, $\in_1$ and $\in_2$. are the dielectric constants as a function of temperature, $T_0$ is reference temperature and $S_1$ and $S_2$ are temperature coefficients of the respective dielectric constants of capacitance as described above. One embodiment for determining $S_1$ and $S_2$ is by extracting the slopes from temperature or voltage dependency plots. In the preceding equations, $d_1$ and $d_2$ are the respective thicknesses of the capacitor dielectrics which are each a dielectric film disposed over a substrate $T_0$, the reference temperature, can be any temperature and may be chosen to be room temperature or an operational temperature of a device formed using the capacitors.

With the above values known or determined, the area ratio $(A_1/A_2)$ of the two dielectrics is determined at step 107. With the above parameters, the area ratio $(A_1/A_2)$ ensures zero temperature dependency. The area ratio $(A_1/A_2)$ represents the ratio of surface areas of the dielectric films formed over a substrate surface for a capacitor with vertically separated and electrically isolated plates. Once the ratio is determined, the areas of the individual dielectrics can be determined once the total capacitor area is determined. At step 109, the total area of the capacitor is identified and used to determine the actual area of each of the capacitor portions based on the area ratio determined at step 107. At step 111, capacitors with the desired area ratios and desired total areas are formed. These capacitors are therefore temperature independent. In various embodiments of the disclosure, the two dielectrics are arranged side by side over a substrate and separate vertically separated capacitor plates of vertical capacitors, i.e capacitors with their capacitor plates vertically separated by one or more dielectrics. Various embodiments of configurations of such capacitors will be shown in FIGS. 2-7, below.

Although the foregoing description was done in using temperature and for providing temperature independent capacitors, the same could be done using voltage independency, i.e. at step 105, two dielectrics with opposite voltage coefficients are determined and voltage coefficients of the respective dielectric constants are used instead of $S_1$ and $S_2$ in various embodiments of the disclosure.

The following embodiment is an embodiment of the disclosure in which the capacitor dielectric is formed of SiO and SiN, and the thicknesses are chosen such that the capacitance densities $c_1$ and $c_2$ are equal. In this embodiment, the thickness ratio of SiO:SiN is 3.9:7.5 or about 0.52:1 because the respective dielectric constants $\in_1$ and $\in_2$ of SiO and SiN are 3.9 and 7.5, respectively and capacitance density $c_1 = \in_1 / d_1$. The produces an $A_{SiO}:A_{SiN}$ area ratio of about 1.15:1 using the previous mathematical relationships. This embodiment is illustrative and not limiting of the disclosure. The following FIGS. 2-8 illustrate various embodiments of capacitor configurations using two dielectrics to produce a temperature or voltage independent capacitor, as described above. Although each of the figures is described in conjunction with the SiN and SiO embodiment, it should be understood that this is illustrative only and the description of FIGS. 2-8 applies equally to capacitors formed using any two dielectrics and various relative thicknesses that produce a temperature or voltage independent capacitor as described above.

Various embodiments of the disclosure include various capacitor configurations having various capacitor dielectric thicknesses. In some embodiments, there are two capacitor electrodes with a capacitor dielectric therebetween, the capacitor dielectric having areas of an SiO dielectric and areas of an SiN dielectric such that the ratios of the respective SiN and SiO areas produces a temperature and voltage independent capacitor. In other embodiments, the MIM capacitive device includes multiple electrodes on multiple device levels of a multilevel semiconductor device. In some embodiments, a number of discrete capacitors are wired together in parallel. In some embodiments, each of the dielectrics has the same thickness and in other embodiments, different thicknesses are used, as above.

Figure 2:
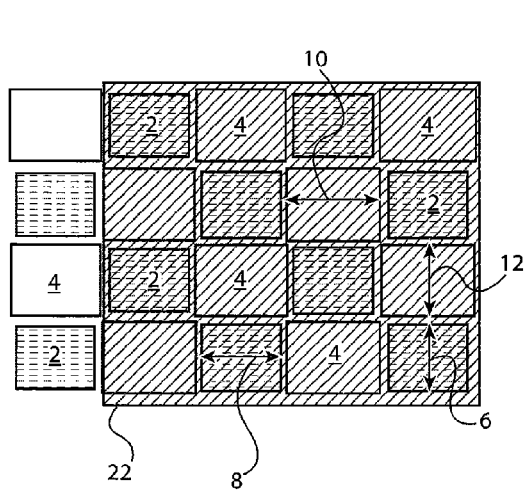
FIG. 2 is a plan view of an embodiment of a MIM capacitive device according to various embodiments of the disclosure.
Figure 3:
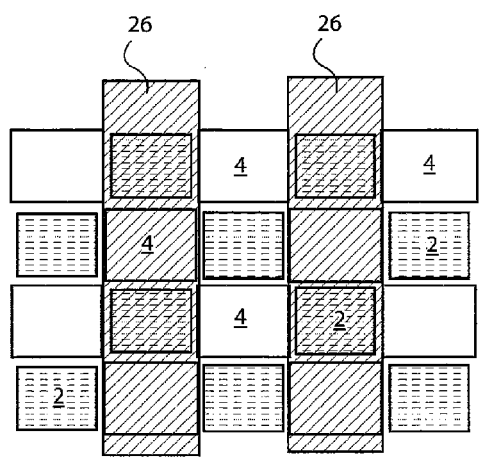
FIG. 3 is a plan view of another embodiment of a MIM capacitive device according to various embodiments of the disclosure.
Figure 4:
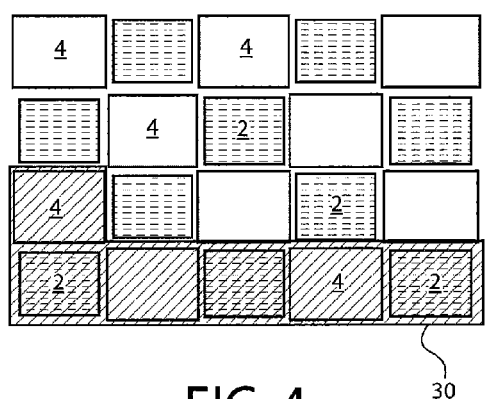
FIG. 4 is a plan view of another embodiment of a MIM capacitive device according to various embodiments of the disclosure.

FIGS. 2-4 are each plan views that show SiN dielectric portions and SiO dielectric portions arranged in checkerboard fashion, i.e., each of the SiN portions and SiO portions are rectangular in shape and are adjacent one another. Various patterning methods are used to form the multiple SiN portions 2 and SiO portions 4 arranged as shown in FIGS. 2-4. FIGS. 2-4 appear on the same drawing sheet to illustrate that in some embodiments, the same arrangement of SiN portions 2 and SiO portions 4 can be used with various combinations of electrode configurations so long as the ratio of $A_{SiO}:A_{SiN}$ is about 1.15:1 in the total capacitor dielectric area. Although the SiN portions 2 and SiO portions 4 are both shown as being rectangular in FIGS. 2-4, in other embodiments, SiN portions 2 and SiO portions 4 have other shapes. In the embodiment of FIGS. 2-4, SiN portions 2 are laterally adjacent SiO portions 4 and this, too, is according to some embodiments, but it is different in other embodiments. In some embodiments, SiN portions 2 are laterally conterminous with adjacent SiO portions 4 and in some embodiments they are spaced apart.

In each of FIGS. 2-4, an upper electrode or electrodes is shown. SiN portions 2 include lateral dimensions 6 and 8 and SiO portions 4 include lateral dimensions 10 and 12. Lateral dimensions 6, 8, 10, 12 vary in various embodiments, and range from about 0.5 microns to about 500 microns in some embodiments, but other dimensions are used in other embodiments.

FIG. 2 includes rectangular shaped upper electrode 22, FIG. 3 includes two rectangular upper electrodes 26, and FIG. 4 includes one inverse-L shaped upper electrode 30. In each of FIGS. 2 and 4, the corresponding lower electrode (not shown) may have the same size and location as the corresponding upper electrode, and in other embodiments, the lower electrode extends below all of the SiN portions 2 and SiO portions 4 shown in the figures, as the total capacitance is determined by the dielectric area between two electrodes.

Upper capacitor electrodes 22, 26 and 30 include various areas in various embodiments. In some embodiments, the area of the upper capacitor plate lies within a range of about 1 μm² to about 1 mm².

Note that in the illustrated embodiments of FIGS. 2-4, each SiN portion 2, defined by dimensions 6 and 8, has a smaller area than SiO portions 4. In some embodiments, the ratio of the areas of the individual SiN portions 2 to SiO portions 4 is about 2.6:3, i.e., about 1:1.15. As such, the upper capacitor electrodes can be formed to cover an equal number of SiN portions 2 and SiO portions 4 to provide the overall ratio of about 1.15:1 (SiO:SiN). In other embodiments, the individual SiN portions 2 and SiO portions 4 have different relative sizes and in such embodiments, the electrode or electrodes are formed to include various portions of various numbers of individual SiN portions 2 and SiO portions 4, such that the overall ratio of capacitor dielectric between effective capacitor electrodes, is about 1.15:1 (SiO:SiN). In some embodiments, the individual SiN portions 2 and SiO portions 4 have the same area and according to this embodiment, the upper capacitor electrode or electrodes are formed over an unequal number of SiN portions 2 and SiO portions 4 or over a particular number of individual SiN portions 2 and SiO portions 4 and overhanging additional portions of additional SiO portions 4.

Figure 5:
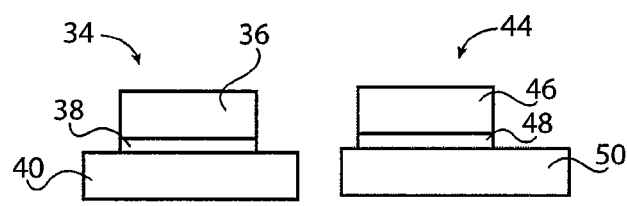
FIG. 5 is a side, cross-sectional view of an embodiment of an MIM capacitive device according to various embodiments of the disclosure.

FIG. 5 shows an embodiment in which two discrete capacitors are formed and coupled together in parallel to form a capacitive device according to one embodiment of the disclosure. SiN capacitor 34 includes upper electrode 36, SiN dielectric 38 and lower electrode 40. SiO capacitor 44 includes upper electrode 46, SiO dielectric 48 and lower electrode 50. According to the illustrated embodiment in which two capacitors combine to form the capacitive device according to the disclosure, the relative area of SiO dielectric 48 to SiN dielectric 38 is about 1.15:1, i.e. the total capacitive area of SiO capacitor 44 is about 1.15 times the capacitive area of SiN capacitor 34 and the thicknesses are chosen such that the capacitance densities of SiO dielectric 48 and SiN dielectric 38 are the same. The thickness 39 of SiN dielectric 38 may range from about 10 Å to about 1 μm in various embodiments of the disclosure and the relative thicknesses of SiN dielectric 38 and SiO dielectric 48 are as described above. According to the embodiment in FIG. 5, lower electrodes 40 and 50 are formed of the same metal layer and upper electrodes 36 and 46 are also formed of the same metal layer. Although only two discrete capacitors are used to form the capacitive device in FIG. 5, it should be understood that various other numbers of discrete capacitors are combined to form the capacitive device with the desired area ratio in other embodiments. Although not illustrated in FIG. 5, SiN capacitor 34 and SiO capacitor 44 are coupled together in parallel using various wiring techniques.

Figure 6:
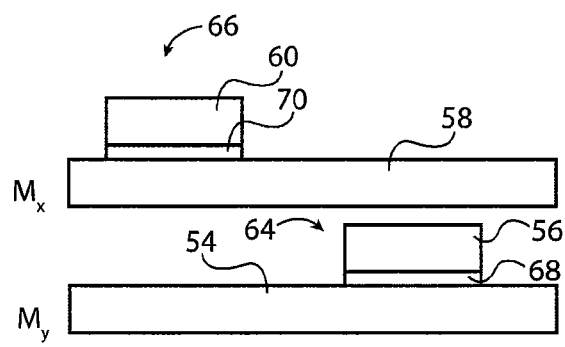
FIG. 6 is a cross-sectional view of another embodiment of an MIM capacitive device according to various embodiments of the disclosure.

FIG. 5 is a cross-sectional view showing a multilevel metal semiconductor device according to various embodiments of the disclosure. FIG. 6 is a cross section showing first metal level 54, second metal level 56, third metal level 58, and fourth metal level 60. The four metal levels are identified for relative positions only and it should be understood that first metal level 54 may be the lowermost metal level in a multilevel metal semiconductor device or it may represent the second, third, fourth, etc. metal level in a multilevel metal semiconductor device. FIG. 6 shows two capacitors, SiO capacitor 64 and SiN capacitor 66. In other embodiments, the electrodes of the capacitive device may be present on a greater number of metal levels. SiO capacitor 64 includes SiO dielectric 68 and SiN capacitor 66 includes SiN dielectric 70. In the embodiment of FIG. 6 which includes capacitors at different metal levels, and in which the capacitive device of the disclosure is formed of two capacitors, i.e. SiO capacitor 64 and SiN capacitor 66, the ratio of the area of SiO dielectric 68 to SiN dielectric 70 is about 1.5:1 and the thickness ratio of SiO dielectric 68 to SiN dielectric 70 is as described above.

According to the embodiments shown in FIGS. 5 and 6, the two capacitors are coupled together in parallel to form a capacitive device that is both temperature independent and voltage independent, as described above. In some embodiments, upper electrodes 60 and 56 are coupled together by vias but other wiring arrangements are used in other embodiments. Similarly, in some embodiments, lower electrodes 54 and 58 are coupled together using vias in some embodiments but other wiring techniques are used in other embodiments.

Figure 7:
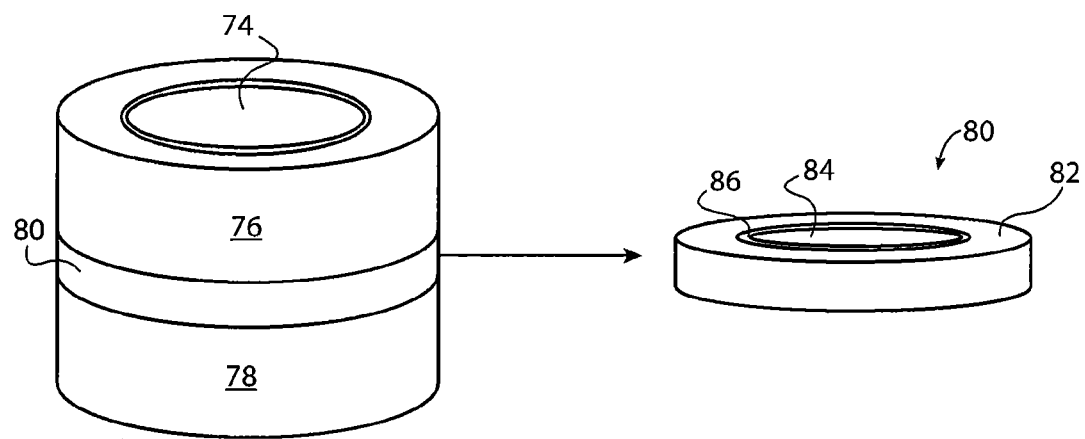
FIG. 7 is a perspective view of an embodiment of an MIM capacitive device according to various embodiments of the disclosure.

FIG. 7 is a plan view showing another capacitive device according to various embodiments of the disclosure. In FIG. 7, both upper electrodes 74 and 76 and lower electrode 78 are non-rectilinear in shape. In the embodiment of FIG. 7, upper electrode 76 is annular in shape and upper electrode 74, lower electrode 78 and capacitor dielectric 80 are circular in shape. Capacitor dielectric 80 is shown in further detail on the right-hand side of FIG. 7 and includes SiN portion 82 and SiO portion 84. SiN portion 82 and SiN portion 84 are separated by void area 86 and according to this embodiment, although they are adjacent one another and covered by a single upper electrode in another embodiment. The ratio of the area of SiO portion 84 to SiN portion 82 is about 1.15:1. In other embodiments, other electrode shapes are used and the electrode shapes may be rectilinear or non-rectilinear in various embodiments.

Figure 8:
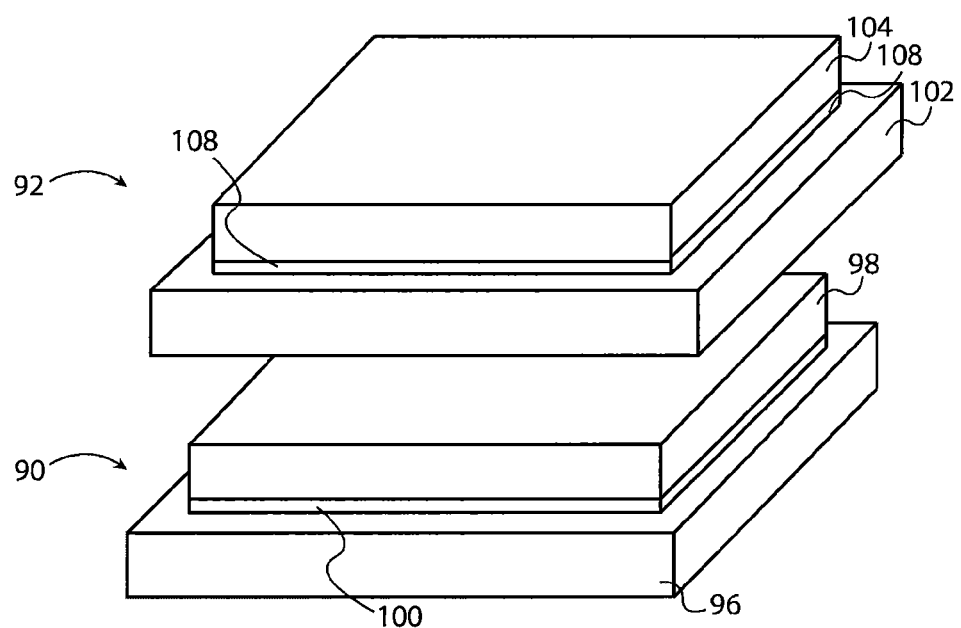
FIG. 8 is a perspective view of another embodiment of an MIM capacitive device according to various embodiments of the disclosure.

FIG. 8 shows another embodiment of a multilayer capacitive device. FIG. 8 shows bottom capacitor 90 and upper capacitor 92. Bottom capacitor 90 includes bottom electrode 96 and top electrode 98, and top capacitor 92 includes bottom electrode 102 and top electrode 104. In the embodiment of FIG. 8, capacitors 90, 92 are stacked directly above one another and vertically isolated by a dielectric (not shown). Bottom capacitor 90 includes SiO dielectric 100 and top capacitor 92 includes SiN dielectric 108. In the embodiment of FIG. 8, the relative areas of SiO dielectric 100 to SiN dielectric 108 is about 1.15:1.

Although the above description of the illustrations of FIGS. 2-8 was done according the embodiment in which SiO and SiN were used, and according to the embodiment in which the relative thicknesses of the two dielectrics SiO and SiN were about 3.9:7.5 or about 0.52:1, other dielectrics and different thicknesses are use in other embodiments.

The disclosure provides a methodology for formulating temperature/or voltage independent MIM capacitors using SiO and SiN in one embodiment and using other dielectric materials in other embodiments. Various combinations of dielectric materials with different dielectric coefficients, are combined to form the capacitor dielectric, in various embodiments.

In some embodiments, the capacitor with the highest linearity over a broad temperature range is produced. In some embodiments, the capacitor with the highest linearity over a broad voltage range is produced. In some embodiments, the capacitor with the highest linearity over a broad temperature range has the same area ratio as the capacitor having the highest linearity over a broad voltage range but in other embodiments, capacitors with different area ratios are identified.

According to the above-described methodology, a vertical capacitive device is formed that includes one or more lower electrodes, one or more upper electrodes includes the first dielectric and second dielectric in the desired area ratio.

According to one aspect, a MIM (metal insulator metal) capacitive device in a semiconductor device, is provided. The capacitive device is formed over or adjacent a substrate and comprises at least two separated and electrically isolated electrodes, and at least one SiN dielectric portion and at least one SiO dielectric portion between the at least two electrically isolated electrodes. The electrically isolated electrodes include a first electrode and a second electrode, the first electrode disposed between the substrate and the second electrode.

In some embodiments, a ratio of respective areas of the at least one SiO dielectric portion to the at least one SiN dielectric portion is at least about 1.15:1.

In some embodiments, the at least one SiN dielectric portion and the at least one SiO dielectric portion are at the same device level and between the separated and electrically isolated lower and upper electrodes.

In some embodiments, the at least one SiN dielectric portion comprises a plurality of the SiN dielectric portions and the at least one SiO dielectric portion comprises a plurality of the SiO dielectric portions and each SiN dielectric portion and each SiO dielectric portion is rectangular and the SiN dielectric portions are laterally conterminous with the SiO dielectric portions.

In some embodiments, the at least two electrodes comprise the first electrode comprising a single common electrode at a first device level and a plurality of discrete further second electrodes at a second device level, each SiO dielectric portion and each SiN dielectric portion disposed only at a single intermediate device level between the first and the second device levels.

In some embodiments, each of the first electrode and second electrode has an annular shape.

In some embodiments, the MIM capacitive device includes a plurality of discrete capacitors wired together in parallel, each discrete capacitor including at least two vertically separated capacitor and electrically isolated electrodes.

In some embodiments, the MIM capacitive device includes a plurality of discrete capacitors wired together in parallel, each discrete capacitor including at least two vertically separated capacitor and electrically isolated electrodes.

According to another aspect, a method for forming a MIM (metal insulator metal) capacitor in a semiconductor device, is provided. The method comprises: selecting two dielectric materials including a first dielectric and a second dielectric having at least one of different temperature coefficients of capacitance and different voltage coefficients of capacitance;

determining a desired ratio of areas of the first dielectric material to the second dielectric material that produces a capacitor that is at least one of voltage independent and temperature independent; and forming a capacitor including at least a first plate at a first device level and separated and electrically isolated from at least one second plate at a second device level with a capacitor dielectric therebetween, the capacitor dielectric including at least one portion of the first dielectric and at least one portion of the second dielectric.

In some embodiments, each at least one portion of the first dielectric and each at least one portion of the second dielectric is disposed at a level between the first and second device levels, the forming a capacitor includes forming the at least one portion of the first dielectric and the at least one portion of the second dielectric over at the at least a first lower electrode disposed over a substrate, and wherein a ratio of a first area of the at least one portion of the first dielectric to a second area of the at least one portion of the second dielectric, is the desired ratio.

In some embodiments, each of the first and second areas is a surface of a dielectric film.

In some embodiments, the first dielectric comprises SiO, the second dielectric comprises SiN and the desired ratio comprises an area ratio of the SiO dielectric to the SiN dielectric of about 1.15:1.

In some embodiments, the method further comprises selecting a thickness of each of the first dielectric and second dielectric and wherein the determining comprises using a mathematical relationship that includes each of the thicknesses.

In some embodiments, the determining comprises determining the desired ratio of areas $A_1/A_2$ using an equation of:

$$\frac{\epsilon_1(T_o)A_1}{d_1}S_1 = \frac{\epsilon_2(T_o)A_2}{d_2}S_2$$

wherein $c_1$ and $c_3$ represent capacitance density per unit area of the respective first and second dielectrics, $\in_1$ and $\in_2$. represent dielectric constants of the first and second dielectrics, respectively, as a function of temperature, $T_0$ is reference temperature and $S_1$ and $S_2$ are temperature coefficients of the respective dielectric constants of the first and second dielectrics and $d_1$ and $d_2$ represent respective thicknesses of the of the first and second dielectrics.

In some embodiments, the selecting comprises forming a first further capacitor having the first dielectric and forming a second further capacitor having the second dielectric and measuring capacitance as a function of voltage for each of the first and second further capacitors or measuring capacitance as a function of temperature for each of the first and second further capacitors.

In some embodiments, the different temperature coefficients of capacitance comprise temperature coefficients of capacitance having different mathematical signs and wherein the different voltage coefficients of capacitance comprise voltage coefficients of capacitance having different mathematical signs.

According to an aspect of the disclosure, a method for forming a temperature and/or voltage independent MIM (metal insulator metal) capacitive device in a semiconductor device, is provided. The method comprises: selecting two dielectric materials including a first dielectric and a second dielectric having at least one of temperature coefficients of capacitance having opposite signs, and voltage coefficients of capacitance having opposite signs; determining a desired ratio of areas of the first dielectric material to the second dielectric material in a capacitor dielectric area that produces a capacitor that is at least one of voltage independent and temperature independent; and forming a MIM capacitive device including at least one capacitor and a capacitor dielectric over a substrate, each capacitor including capacitor plates separated and electrically insulated by the capacitor dielectric, the capacitor plates including at least one first level capacitor plate and at least one second level capacitor plate, the at least one first level capacitor plate disposed between the at least one second level capacitor plate and the substrate, wherein the capacitive device includes a total capacitor dielectric area including a first area of the first dielectric and a second area of the second dielectric, and a ratio of a first area of the first dielectric to a second area of the second dielectric, is the desired ratio.

In some embodiments, the method further comprises selecting a thickness of each of the first dielectric material and second dielectric material and wherein the determining comprises determining the desired ratio of areas $A_1/A_2$ using an equation of:

$$\frac{\epsilon_1(T_o)A_1}{d_1}S_1 = \frac{\epsilon_2(T_o)A_2}{d_2}S_2$$

wherein $c_1$ and $c_2$ represent capacitance density per unit area of the respective first and second dielectrics, $\in_1$ and $\in_2$. represent dielectric constants of the first and second dielectrics, respectively, as a function of temperature, $T_0$ is reference temperature and $S_1$ and $S_2$ are temperature coefficients of the respective dielectric constants of the first and second dielectrics and $d_1$ and $d_2$ represent respective thicknesses of the of the first and second dielectrics.

In some embodiments, the forming the MIM capacitive device includes forming a plurality of discrete capacitors wired together in parallel, the plurality of discrete capacitors including the associated capacitor plates formed on at least four device levels of a multilevel metal device.

In some embodiments, the selecting two dielectric materials includes forming a first further capacitor having the first dielectric and forming a second further capacitor having the second dielectric and measuring capacitance as a function of temperature for each of the first and second further capacitors.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A MIM (metal insulator metal) capacitive device in a semiconductor device, said capacitive device disposed adjacent a substrate and comprising at least two separated and electrically isolated electrodes, and at least one SiN dielectric portion and at least one SiO dielectric portion between said at least two electrically isolated electrodes and said electrically isolated electrodes include a first electrode and a second electrode, said first electrode disposed between said substrate and said second electrode, wherein said at least one SiN dielectric portion and said at least one SiO dielectric portion are disposed side by side at the same device level.

2. The MIM capacitive device as in claim 1, wherein a ratio of respective areas of said at least one SiO dielectric portion to said at least one SiN dielectric portion is at least about 1.15:1.

3. The MIM capacitive device as in claim 1, wherein said at least one SiN dielectric portion and said at least one SiO dielectric portion are laterally conterminous.

4. The MIM capacitive device as in claim 1, wherein said at least one SiN dielectric portion comprises a plurality of said SiN dielectric portions and said at least one SiO dielectric portion comprises a plurality of said SiO dielectric portions and each said SiN dielectric portion and each said SiO dielectric portion is rectangular and said SiN dielectric portions are laterally conterminous with said SiO dielectric portions.

5. The MIM capacitive device as in claim 2, wherein said at least two electrically isolated electrodes comprise said first electrode comprising a single common electrode at a first device level and a plurality of discrete further second electrodes at a second device level, each said SiO dielectric portion and each said SiN dielectric portion disposed only at a single intermediate device level between said first and said second device levels.

6. The MIM capacitive device as in claim 1, wherein each of said first electrode and second electrode has an annular shape.

7. The MIM capacitive device as in claim 2, wherein said MIM capacitive device includes a plurality of discrete capacitors wired together in parallel, each discrete capacitor including at least two vertically separated capacitor and electrically isolated electrodes.

8. The MIM capacitive device as in claim 7, wherein said semiconductor device is a multilevel metal device and said plurality of discrete capacitors include said associated capacitor plates formed on at least four device levels of said multilevel metal device.

9. A method for forming a MIM (metal insulator metal) capacitor in a semiconductor device, said method comprising:
    selecting two dielectric materials including a first dielectric and a second dielectric having at least one of different temperature coefficients of capacitance and different voltage coefficients of capacitance;
    determining a desired ratio of areas of said first dielectric material to said second dielectric material that produces a capacitor that is at least one of voltage independent and temperature independent; and
    forming a capacitor including at least a first plate at a first device level and at least a second plate at a second device level with a capacitor dielectric therebetween, wherein said first and second plates are vertically separated and electrically isolated from each other, and wherein said capacitor dielectric includes at least one portion of said first dielectric and at least one portion of said second dielectric.

10. The method as in claim 9, wherein each said at least one portion of said first dielectric and each said at least one portion of said second dielectric is disposed at a level between said first and second device levels,
    said forming a capacitor includes forming said at least one portion of said first dielectric and said at least one portion of said second dielectric over at said at least a first lower electrode disposed over a substrate, and
    wherein a ratio of a first area of said at least one portion of said first dielectric to a second area of said at least one portion of said second dielectric, is said desired ratio.

11. The method as in claim 10, wherein each of said first and second areas is a surface of a dielectric film.

12. The method as in claim 9, wherein said first dielectric comprises SiO, said second dielectric comprises SiN and said desired ratio comprises an area ratio of said SiO dielectric to said SiN dielectric of about 1.15:1.

13. The method as in claim 9, further comprising selecting a thickness of each of said first dielectric and second dielectric and wherein said determining comprises using a mathematical relationship that includes each of said thicknesses.

14. The method as in claim 13, wherein said determining comprises determining said desired ratio of areas $A_1/A_2$ using an equation of:

$$\frac{\epsilon_1(T_o)A_1}{d_1}S_1 = \frac{\epsilon_2(T_o)A_2}{d_2}S_2$$

wherein $c_1$ and $c_2$ represent capacitance density per unit area of the respective first and second dielectrics, $\epsilon_1$ and $\epsilon_2$ represent dielectric constants of said first and second dielectrics, respectively, as a function of temperature, $T_0$ is reference temperature and $S_1$ and $S_2$ are temperature coefficients of the respective dielectric constants of said first and second dielectrics and $d_1$ and $d_2$ represent respective thicknesses of said of said first and second dielectrics.

15. The method as in claim 9, wherein said selecting comprises forming a first further capacitor having said first dielectric and forming a second further capacitor having said second dielectric and measuring capacitance as a function of voltage for each of said first and second further capacitors or measuring capacitance as a function of temperature for each of said first and second further capacitors.

16. The method as in claim 9, wherein said different temperature coefficients of capacitance comprise temperature coefficients of capacitance having different mathematical signs and wherein said different voltage coefficients of capacitance comprise voltage coefficients of capacitance having different mathematical signs.

17. A method for forming a temperature and/or voltage independent MIM (metal insulator metal) capacitive device in a semiconductor device, said method comprising:
selecting two dielectric materials including a first dielectric and a second dielectric having at least one of temperature coefficients of capacitance having opposite signs, and voltage coefficients of capacitance having opposite signs;
determining a desired ratio of areas of said first dielectric material to said second dielectric material in a capacitor dielectric area that produces a capacitor that is at least one of voltage independent and temperature independent; and
forming a MIM capacitive device including at least one capacitor and a capacitor dielectric adjacent a substrate, each capacitor including capacitor plates separated and electrically insulated by said capacitor dielectric, said capacitor plates including at least one first level capacitor plate and at least one second level capacitor plate, the at least one first level capacitor plate disposed between the at least one second level capacitor plate and the substrate
wherein said capacitive device includes a total capacitor dielectric area including a first area of said first dielectric and a second area of said second dielectric, and a ratio of a first area of said first dielectric to a second area of said second dielectric, is said desired ratio.

18. The method as in claim 17, further comprising selecting a thickness of each of said first dielectric material and second dielectric material and wherein said determining comprises determining said desired ratio of areas $A_1/A_2$ using an equation of:

$$\frac{\epsilon_1(T_o)A_1}{d_1}S_1 = \frac{\epsilon_2(T_o)A_2}{d_2}S_2$$

wherein $c_1$ and $c_2$ represent capacitance density per unit area of the respective first and second dielectrics, $\epsilon_1$ and $\epsilon_2$ represent dielectric constants of said first and second dielectrics, respectively, as a function of temperature, $T_0$ is reference temperature and $S_1$ and $S_2$ are temperature coefficients of the respective dielectric constants of said first and second dielectrics and $d_1$ and $d_2$ represent respective thicknesses of said of said first and second dielectrics.

19. The method as in claim 17, wherein said forming said MIM capacitive device includes forming a plurality of discrete capacitors wired together in parallel, said plurality of discrete capacitors including said associated capacitor plates formed on at least four device levels of a multilevel metal device.

20. The method as in claim 17, wherein said selecting two dielectric materials includes forming a first further capacitor having said first dielectric and forming a second further capacitor having said second dielectric and measuring capacitance as a function of temperature for each of said first and second further capacitors.

* * * * *